United States Patent
Mittal et al.

(10) Patent No.: US 8,576,096 B2
(45) Date of Patent: Nov. 5, 2013

(54) APPARATUS AND METHOD FOR LOW COMPLEXITY COMBINATORIAL CODING OF SIGNALS

(75) Inventors: Udar Mittal, Hoffman Estates, IL (US); James P. Ashley, Naperville, IL (US)

(73) Assignee: Motorola Mobility LLC, Libertyville, IL (US)

(*) Notice: Subject to any disclaimer, the term of this patent is extended or adjusted under 35 U.S.C. 154(b) by 1250 days.

(21) Appl. No.: 12/047,589

(22) Filed: Mar. 13, 2008

(65) Prior Publication Data

US 2009/0100121 A1    Apr. 16, 2009

Related U.S. Application Data

(60) Provisional application No. 60/979,118, filed on Oct. 11, 2007.

(51) Int. Cl.
*H03M 7/34* (2006.01)

(52) U.S. Cl.
USPC .............................................. 341/50; 341/51

(58) Field of Classification Search
USPC ........ 341/51, 50; 708/200, 400; 704/219, 500
See application file for complete search history.

(56) References Cited

U.S. PATENT DOCUMENTS

| | | | |
|---|---|---|---|
| 4,560,977 A | 12/1985 | Murakami et al. | |
| 4,670,851 A | 6/1987 | Murakami et al. | |
| 4,727,354 A | 2/1988 | Lindsay | |
| 4,853,778 A | 8/1989 | Tanaka | |
| 5,006,929 A | 4/1991 | Barbero et al. | |
| 5,067,152 A | 11/1991 | Kisor et al. | |
| 5,268,855 A | 12/1993 | Mason et al. | |
| 5,327,521 A | 7/1994 | Savic et al. | |
| 5,394,473 A | 2/1995 | Davidson | |
| 5,692,102 A | 11/1997 | Pan | |
| 5,956,674 A | 9/1999 | Smyth et al. | |
| 5,974,435 A | 10/1999 | Abbott | |
| 6,108,626 A | 8/2000 | Cellario et al. | |
| 6,236,960 B1 | 5/2001 | Peng et al. | |
| 6,253,185 B1 | 6/2001 | Arean et al. | |

(Continued)

FOREIGN PATENT DOCUMENTS

| | | |
|---|---|---|
| EP | 1533789 A1 | 5/2005 |
| EP | 0932141 B1 | 8/2005 |

(Continued)

OTHER PUBLICATIONS

Mittal, et al., "Low Complexity Factorial Pulse Coding of MDCT Coefficient Using Approximation of Combinatorial Functions," IEEE Proceedings of the ICASSP, pp. 289-292, Apr. 2007.

(Continued)

*Primary Examiner* — Jean B Jeanglaude

(57) ABSTRACT

During operation of an encoder, a signal vector (x) is received. A first multi-precision operand ($\Psi'_k$) will be generated based on the signal vector to be encoded. A mantissa operand and an exponent operand are generated. Both the mantissa operand and the exponent operand are representative of a second multi-precision operand that is based on the signal vector to be encoded. A portion of $\Psi'_k$ is selected to be modified based on the exponent operand. A part of $\Psi'_k$ is modified based on the mantissa operand to produce a modified multi-precision operand ($\Psi'_{k+1}$). Finally, a multi-precision codeword is generated for use in a corresponding decoder.

20 Claims, 7 Drawing Sheets

Encoder

(56) References Cited

U.S. PATENT DOCUMENTS

| | | |
|---|---|---|
| 6,263,312 B1 | 7/2001 | Kolesnik et al. |
| 6,304,196 B1 | 10/2001 | Copeland et al. |
| 6,453,287 B1 | 9/2002 | Unno et al. |
| 6,493,664 B1 | 12/2002 | Udaya Bhaskar et al. |
| 6,504,877 B1 | 1/2003 | Lee |
| 6,593,872 B2 | 7/2003 | Makino et al. |
| 6,658,383 B2 | 12/2003 | Koishida et al. |
| 6,662,154 B2 * | 12/2003 | Mittal et al. .................. 704/219 |
| 6,691,092 B1 | 2/2004 | Udaya Bhaskar et al. |
| 6,704,705 B1 | 3/2004 | Kabal et al. |
| 6,775,654 B1 | 8/2004 | Yokoyama et al. |
| 6,813,602 B2 | 11/2004 | Thyssen |
| 6,940,431 B2 | 9/2005 | Hayami |
| 6,975,253 B1 | 12/2005 | Dominic |
| 7,031,493 B2 | 4/2006 | Fletcher et al. |
| 7,130,796 B2 | 10/2006 | Tasaki |
| 7,161,507 B2 * | 1/2007 | Tomic ............................. 341/51 |
| 7,180,796 B2 | 2/2007 | Tanzawa et al. |
| 7,212,973 B2 | 5/2007 | Toyama et al. |
| 7,230,550 B1 | 6/2007 | Mittal et al. |
| 7,231,091 B2 | 6/2007 | Keith |
| 7,414,549 B1 | 8/2008 | Yang et al. |
| 7,461,106 B2 * | 12/2008 | Mittal et al. .................. 708/200 |
| 7,761,290 B2 | 7/2010 | Koishida et al. |
| 7,801,732 B2 | 9/2010 | Park et al. |
| 7,840,411 B2 | 11/2010 | Hotho et al. |
| 7,885,819 B2 | 2/2011 | Koishida et al. |
| 7,889,103 B2 | 2/2011 | Mittal et al. |
| 7,996,233 B2 | 8/2011 | Oshikiri |
| 8,060,363 B2 | 11/2011 | Ramo et al. |
| 8,069,035 B2 | 11/2011 | Yoshida |
| 8,160,868 B2 | 4/2012 | Kawashima et al. |
| 8,315,863 B2 | 11/2012 | Oshikiri |
| 2002/0052734 A1 | 5/2002 | Unno et al. |
| 2003/0004713 A1 | 1/2003 | Makino et al. |
| 2003/0009325 A1 | 1/2003 | Kirchherr et al. |
| 2003/0220783 A1 | 11/2003 | Streich et al. |
| 2004/0252768 A1 | 12/2004 | Suzuki et al. |
| 2005/0261893 A1 | 11/2005 | Toyama et al. |
| 2006/0047522 A1 | 3/2006 | Ojanpera |
| 2006/0173675 A1 | 8/2006 | Ojanpera |
| 2006/0190246 A1 | 8/2006 | Park |
| 2006/0222374 A1 | 10/2006 | Gnauck et al. |
| 2006/0241940 A1 | 10/2006 | Ramprashad |
| 2006/0265087 A1 | 11/2006 | Philippe et al. |
| 2007/0171944 A1 | 7/2007 | Schuijers et al. |
| 2007/0239294 A1 | 10/2007 | Brueckner et al. |
| 2007/0271102 A1 | 11/2007 | Morii |
| 2008/0065374 A1 | 3/2008 | Mittal et al. |
| 2008/0120096 A1 | 5/2008 | Oh et al. |
| 2009/0019071 A1 | 1/2009 | Monro |
| 2009/0024398 A1 | 1/2009 | Mittal et al. |
| 2009/0030677 A1 | 1/2009 | Yoshida |
| 2009/0076829 A1 | 3/2009 | Ragot et al. |
| 2009/0100121 A1 | 4/2009 | Mittal et al. |
| 2009/0112607 A1 | 4/2009 | Ashley et al. |
| 2009/0234642 A1 | 9/2009 | Mittal et al. |
| 2009/0259477 A1 | 10/2009 | Ashley et al. |
| 2009/0276212 A1 | 11/2009 | Khalil et al. |
| 2009/0306992 A1 | 12/2009 | Ragot et al. |
| 2009/0326931 A1 | 12/2009 | Ragot et al. |
| 2010/0088090 A1 | 4/2010 | Ramabadran |
| 2010/0169087 A1 | 7/2010 | Ashley et al. |
| 2010/0169099 A1 | 7/2010 | Ashley et al. |
| 2010/0169100 A1 | 7/2010 | Ashley et al. |
| 2010/0169101 A1 | 7/2010 | Ashley et al. |
| 2011/0156932 A1 | 6/2011 | Mittal et al. |
| 2011/0161087 A1 | 6/2011 | Ashley et al. |
| 2011/0218797 A1 | 9/2011 | Mittal et al. |
| 2011/0218799 A1 | 9/2011 | Mittal et al. |

FOREIGN PATENT DOCUMENTS

| | | |
|---|---|---|
| EP | 1619664 A1 | 1/2006 |
| EP | 1483759 B1 | 9/2006 |
| EP | 1818911 A1 | 8/2007 |
| EP | 1912206 A1 | 4/2008 |
| EP | 1845519 B1 | 9/2009 |
| EP | 1959431 B1 | 6/2010 |
| RU | 2137179 C1 | 9/1999 |
| WO | 9715983 A1 | 5/1997 |
| WO | 03073741 A2 | 9/2003 |
| WO | 2007012794 A2 | 2/2007 |
| WO | 2007063910 A1 | 6/2007 |
| WO | 2008063035 A1 | 5/2008 |
| WO | 2010003663 A1 | 1/2010 |

OTHER PUBLICATIONS

Ashley, et al., "Wideband Coding of Speech Using a Scalable Pulse Codebook," IEEE Proceedings of the Speech Coding Workshop, pp. 148-150, Sep. 2000.

Mittal, et al., "Coding Unconstrained FCB Excitation Using Combinatorial and Huffman Codes," IEEE Proceedings of the Speech Coding Workshop, pp. 129-131, Oct. 2002.

3GPP TS 26.290 v7.0.0 (Mar. 2007) 3rd Generation Partnership Project; Technical Speciification Group Service and System Aspects; Audio codec processing functions; Extended Adaptive Multi0Rate-Wideband (AMR-WB+) codec; Transcoding functions (Release 7).

Chen et al.; "Adaptive Postifiltering for Quality Enhancement of Coded Speech" IEEE Transactions on Speech and Audio Processing, vol. 3, No. 1, Jan. 1995, pp. 59-71.

Chan et al.; "Frequency domain postfiltering for multiband excited linear predictive coding of speech" Electronics Letters, Jun. 6, 1996, vol. 32 No. 12; pp. 1061-1063.

Andersen et al.; "Reverse Water-Filling in Predictive Encoding of Speech" IEEE 1999 pp. 105-107.

International Telecommunication Union, "G.729.1, Series G: Transmission Systems and Media, Digital Systems and Networks, Digital Terminal Equipments—Coding of analogue signals by methods other than PCM, G.729 based Embedded Variable bit-rate coder: An 8-32 kbit/s scalable wideband coder bitstream interoperatble with G.729" ITU=T Recommendation G.729.1, May, 2006, Cover page, pp. 11-18. Full document available at: http://www.itu.int/rec/T-REC-G.729.1-200605-1/en.

Makinen et al., "AMR-WB+: a new audio coding standard for 3rd generation mobile audio service", In 2005 Proceedings IEEE International Conference on Acoustics, Speech and Signal Processing, vol. 2, pp. ii/1109-ii/1112, Mar. 18, 2005.

Faller et al., "Technical advances in digital audio radio broadcasting", Proceedings of the IEEE, vol. 90, No. 8, pp. 1303-1333, Aug. 1, 2002.

Salami et al., "Extended AMR-WB for High-Quality Audio on Mobile Devices", IEEE Communications Magazine, pp. 90-97, May 1, 2006.

Ratko V. Tomic: "Fast, Optimal Entropy Coder", 1stWorks Corporation Technical Report, TR04-0815, Aug. 15, 2004, all pages.

Ramprashad: "A Two Stage Hybrid Embedded Speech/Audio Coding Structure" Proceedings of International Conference on Acoustics, Speech, and Signal Processing, ICASSP 1998 May 1998, vol. 1, pp. 337-340.

Kovesi et al.; "A Scalable Speech and Audio Coding Scheme with Continuous Bitrate Flexibility" Proceeding of International Conference on Acoustics, Speech, and Signal Processing, 2004, Piscataway, JY vol. 1, May 17, 2004 pp. 273-276.

Kim et al.; "A New Bandwidth Scalable Wideband Speech/Aduio Coder" Proceedings of Proceedings of International Conference on Acoustics, Speech, and Signal Processing, ICASSP; Orland, FL; ; vol. 1, May 13, 2002 pp. 657-660.

Ramprashad: "High Quality Embedded Wideband Speech Coding Using an Inherently Layered Coding Paradigm" Proceedings of International Conference on Acoustics, Speech, and Signal Processing, ICASSP 2000, vol. 2, Jun. 5-9, 2000 pp. 1145-1148.

Princen et al., "Subband/Transform Coding Using Filter Bank Designs Based on Time Domain Aliasing Cancellation" IEEE 1987; pp. 2161-2164.

(56) References Cited

OTHER PUBLICATIONS

Ramprashad: "Embedded Coding Using a Mixed Speech and Audio Coding Paradigm" International Journal of Speech Technology Kluwer Academic Publishers Netherlands, Vo. 2, No. 4, May 1999, pp. 359-372.
Edler "Coding of Audio Signals with Overlapping Block Transform and Adaptive Window Functions"; Journal of Vibration and Low Voltage fnr; vol. 43, 1989, Section 3.1.
Virette et al "Adaptive Time-Frequency Resolution in Modulated Transform at Reduced Delay" ICASSP 2008; pp. 3781-3784.
Markas et al. "Multispectral Image Compression Algorithms"; Data Compression Conference, 1993; Snowbird, UT USA Mar. 30-Apr. 2, 1993; pp. 391-400.
Mittal et al., Low complexity factorial pulse coding of MDCT coefficients using approximation of combinatorial functions, Acoustics, Speech and Signal Processing, 2007. ICASSP 2007. IEEE International Conference on, Apr. 1, 2007, pp. I-289-I-292.
"Enhanced Variable Rate Codec, Speech Service Options 3, 68, and 70 for Wideband Spread Spectrum Digital Systems", 3GPP2 TSG-C Working Group 2, XX, XX, No. C. S0014-C, Jan. 1, 2007, pp. 1-5.
J. Fessler, "Chapter 2; Discrete-time signals and systems" May 27, 2004, pp. 2.1-2.21.
Fuchs et al. "A Speech Coder Post-Processor Controlled by Side-Information" 2005, pp. IV-433-IV-436.
Boris Ya Ryabko et al.: "Fast and Efficient Construction of an Unbiased Random Sequence", IEEE Transactions on Information Theory, IEEE, US, vol. 46, No. 3, May 1, 2000, ISSN: 0018-9448, pp. 1090-1093.
Ratko V. Tomic: "Quantized Indexing: Background Information", May 16, 2006, URL: http://web.archive.org/web/20060516161324/www.1stworks.com/ref/TR/tr05-0625a.pdf, pp. 1-39.
Ido Tal et al.: "On Row-by-Row Coding for 2-D Constraints", Information Theory, 2006 IEEE International Symposium on, IEEE, PI, Jul. 1, 2006, pp. 1204-1208.
Jelinek et al. "Classification-Based Techniques for Improving the Robustness of Celp Coders" 2007, pp. 1480-1484.
Tancerel, L. et al., "Combined Speech and Audio Coding by Discrimination," In Proceedings of IEEE Workshop on Speech Coding, pp. 154-156, (2000).
Jelinek et al. "ITU-T G.EV-VBR Baseline Codec" Apr. 4, 2008, pp. 4749-4752.
Ramo et al. "Quality Evaluation of the G.EV-VBR Speech Codec" Apr. 4, 2008, pp. 4745-4748.
Cadel, et al., "Pyramid Vector Coding for High Quality Audio Compression," IEEE 1997, pp. 343-346, Cefriel, Milano, Italy and Alcatel Telecom, Vimercate, Italy.
Hung, et al., "Error Resilient Pyramid Vector Quantization for Image Compression," IEEE Transactions on Image Processing, vol. 7, No. 10, Oct. 1998, pp. 1373-1386.
Hung, et al., "Error Resilient Pyramid Vector Quantization for Image Compression," IEEE 1994 pp. 583-587, Computer Systems Laboratory, Stanford University, Stanford, CA, USA.
Bruno Bessette: Universal Speech/Audio Coding using Hybrid ACELP/TCX techniques, Acoustics, Speech, and Signal Processing, 2005. Proceedings. (ICASSP '05). IEEE International Conference, Mar. 18-23, 2005, ISSN : III-301-III-304, Print ISBN: 0-7803-8874-7, all pages.
Neuendorf, et al., "Unified Speech Audio Coding Scheme for High Quality oat Low Bitrates" ieee International Conference on Accoustics, Speech and Signal Processing, 2009, Apr. 19, 2009, 4 pages.
T.V. Ramabadran, "A Coding Scheme for m-out-of-n Codes," IEEE Transactions on Communications, vol. 38, No. 8, pp. 1156-1163, Aug. 1990.

"Low-complexity coding at 24 and 32 kbit/s for hands-free operation in systems with low frame loss", ITU-T G.722.1 Telecommunication Standardization Sector of ITU (May 2005).
"Frame error robust narrowband and wideband embedded variable bit-rate coding of speech and audio from 8-32 kbit/s", ITU-T G.718 Telecommunication Standardization Sector of ITU, (Jun. 2008).
Sean A. Ramprashad, "Sparse Bit-Allocations Based on Partial Ordering Schemes With Application to Speech and Audio Coding", IEEE Transactions on Audio, Speech, and Language Processing, vol. 15, No. 1, Jan. 2007.
Xiang Wei, Marilyn J. Shaw and Martin R. Varley, "Optimum Bit Allocation and Decomposition for High Quality Audio Coding", 1997 IEEE International Conference on Acoustics, Speech, and Signal Processing (ICASSP'97)—vol. 1.
Patent Cooperation Treaty, "PCT Search Report and Written Opinion of the International Searching Authority" for International Application No. PCT/US2010/061714 (CS36700AUD) Jun. 29, 2011, 15 pages.
R.V. Tomic, "Quantized Indexing: Background Information", Internet Citation, Jun. 25, 2005, pp. 1-39, XP002535774.
U. Mittal, et al., "Coding pulse sequences using a Combination of Factorial Pulse Coding and Arithmetic Coding", 2010 International Conference on Signal Processing and Communication (SPCOM), IEEE, Piscataway, NJ, USA, Jul. 18, 2010, pp. 1-5.
Hung et al., Error-Resilient Pyramid Vector Quantization for Image Compression, IEEE Transactions on Image Processing, 1994 pp. 583-587.
Hung et al., Error-resilient pyramid vector quantization for image compression, IEEE Transactions on Image Processing, vol. 7, No. 10, Oct. 1, 1998, pp. 1373-1386.
Daniele Cadel, et al. "Pyramid Vector Coding for High Quality Audio Compression", IEEE 1997, pp. 343-346, Cefriel, Milano, Italy and Alcatel Telecom, Vimercate Italy.
3GPP2, "Enhanced variable Rate Codec, Speech Service Options 3, 68, and 70 for Wideband Spread Spectrum Digital Systems," 3Gpp2 TSG-C Working Group 2, XX, XX, No. C.S0014-C, Jan. 1, 2007, pp. 1-5.
Chinese Patent Office (SIPO), 1st Office Action for Chinese Patent Application No. 200980153318.0 dated Sep. 12, 2012, 6 pages.
United States Patent and Trademark Office, "Non-Final Office Action" for U.S. Appl. No. 12/844,199 dated Aug. 31, 2012, 13 pages.
United States Patent and Trademark Office, "Non-Final Rejection" for U.S. Appl. No. 12/047,632 dated Oct. 18, 2011, 16 pages.
United States Patent and Trademark Office, "Non-Final Office Action" for U.S. Appl. No. 12/187,423 dated Sep. 30, 2011, 9 pages.
United States Patent and Trademark Office, "Non-Final Office Action" for U.S. Appl. No. 12/345,165 dated Sep. 1, 2011, 5 pages.
United States Patent and Trademark Office, "Final Rejection" for U.S. Appl. No. 12/099,842 dated Oct. 12, 2011, 24 pages.
European Patent Office, Supplementary Search Report for EPC Patent Application No. 07813290.9 dated Jan. 4, 2013, 8 pages.
Cover, T.M., "Enumerative Source Encoding" IEEE Transactions on Information Theory, IEEE Press, USA vol. IT-19, No. 1; Jan. 1, 1973, pp. 73-77.
Mackay, D., "Information Theory, Inference, and Learning Algorithms" In: "Information Theory, Inference, and Learning Algorithms", Jan. 1, 2004; pp. 1-10.
Korean Intellectual Property Office, Notice of Preliminary Rejection for Korean Patent Application No. 10-2010-0725140 dated Jan. 4, 2013.
United States Patent and Trademark Office, "Final Rejection" for U.S. Appl. No. 12/099,842 dated Aug. 8, 2013, 16 pages.

\* cited by examiner

Encoder

Decoder

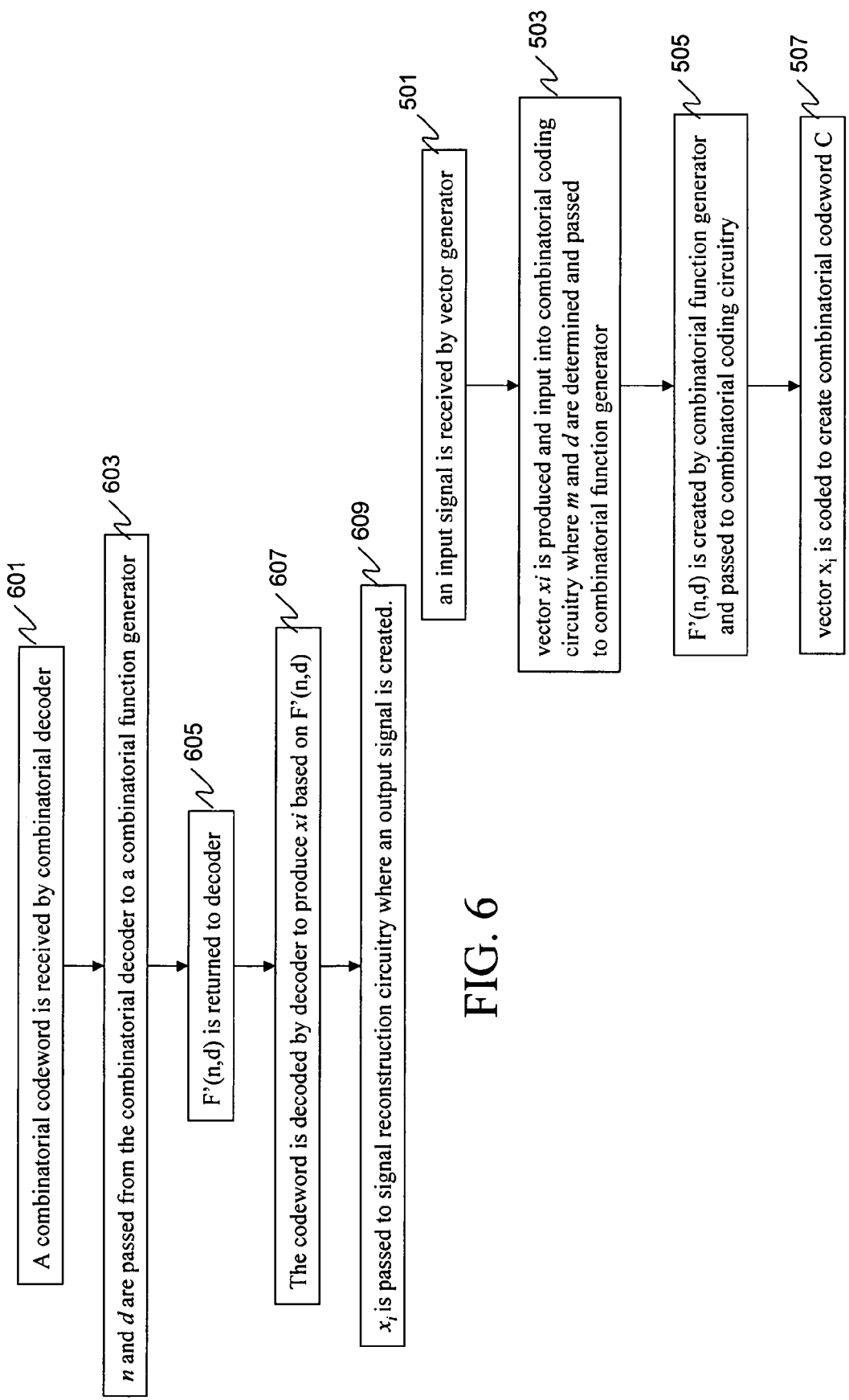

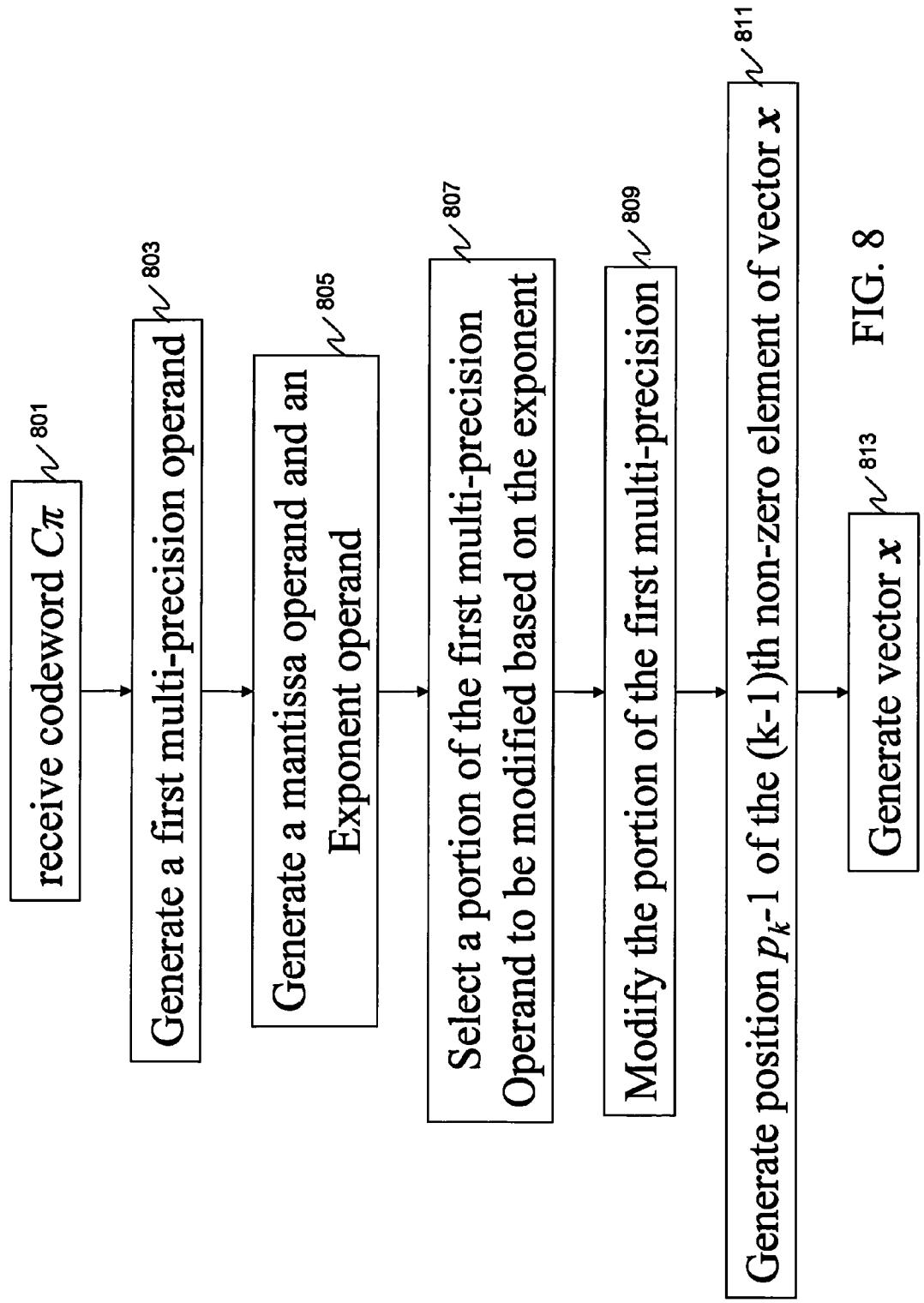

APPARATUS AND METHOD FOR LOW COMPLEXITY COMBINATORIAL CODING OF SIGNALS

This application claims benefit of 60/979,118 filed on Oct. 11, 2007.

FIELD OF THE INVENTION

The present invention relates generally to coding vectors and in particular, to low-complexity combinational Factorial Pulse Coding of vectors.

BACKGROUND OF THE INVENTION

Methods for coding vector or matrix quantities for speech, audio, image, video, and other signals are well known. One such method described in U.S. Pat. No. 6,236,960 by Peng, et. al, (which is incorporated by reference herein) is known as Factorial Pulse Coding (or FPC). FPC can code a vector $x_i$ using a total of M bits, given that:

$$m \sum_{i=0}^{n-1} |x_i|, \quad (1)$$

and all values of vector $x_i$ are integral valued such that $-m \leq x_i \leq m$ where m is the total number of unit amplitude pulses, and n is the vector length. The total M bits are used to code N combinations in a maximally efficient manner, such that the following expression, which describes the theoretical minimum number of combinations, holds true:

$$N = \sum_{d=1}^{min(m,n)} F(n,d) D(m,d) 2^d \leq 2^M. \quad (2)$$

For this equation, F(n,d) are the number of combinations of d non-zero vector elements over n positions given by:

$$F(n,d) = \frac{n!}{d!(n-d)!}, \quad (3)$$

D(m,d) are the number of combinations of d non-zero vector elements given m total unit pulses given by:

$$D(m, d) = F(m-1, d-1), \quad (4)$$

and $2^d$ represents the combinations required to describe the polarity (sign) of the d non-zero vector elements. The term min(m, n) allows for the case where the number of unit magnitude pulses m exceeds the vector length n. A method and apparatus for coding and decoding vectors of this form have been fully described in the prior art. Furthermore, a practical implementation of this coding method has been described in 3GPP2 standard C.S0014-B, where the vector length n=54 and the number of unit magnitude pulses m=7 produce an M=35 bit codeword.

While these values of n and m do not cause any unreasonable complexity burden, larger values can quickly cause problems, especially in mobile handheld devices which need to keep memory and computational complexity as low as possible. For example, use of this coding method for some applications (such as audio coding) may require n=144 and m=28, or higher. Under these circumstances, the cost associated with producing the combinatorial expression F(n,d) using prior art methods may be too high for practical implementation.

In looking at this cost in greater detail, we can rewrite Eq. 3 as:

$$F(n,d) = \frac{\prod_{i=n-d+1}^{n} (i)}{\prod_{j=1}^{d} (j)}. \quad (5)$$

Direct implementation is problematic because F(144, 28) would require 197 bits of precision in the numerator and 98 bits of precision in the nominator to produce a 99 bit quotient. Since most digital signal processors (DSPs) used in today's handheld devices typically support only 16 bit×16 bit multiply operations, special multi-precision multiply/divide routines would need to be employed. Such routines require a series of nested multiply/accumulate operations that typically require on the order of k multiple/accumulate (MAC) operations, where k is the number of 16 bit segments in the operand. For a 197 bit operand, k=⌈197/16⌉=13. So, execution of a single 197×16 bit multiply would require a minimum of 13 MAC operations plus shifting and store operations. The denominator term is calculated in a similar manner to produce a 98 bit result. In addition, a 197/98 bit division is required, which is an extremely complex operation, thus computation of the entire factorial relation in Eq. 5 would require considerable resources.

In an effort to reduce complexity, Eq. 5 can be rewritten in to distribute the divide operations to produce the following:

$$F(n,d) = \text{round}\left[\left(\frac{n}{d}\right) \cdot \left(\frac{n-1}{d-1}\right) \cdot \left(\frac{n-2}{d-2}\right) \cdots \left(\frac{n-d+2}{2}\right) \cdot \left(\frac{n-d-1}{1}\right)\right] \quad (6)$$

In this expression, the dynamic range of the divide operations is reduced, but unfortunately, increased resolution of the quotient is needed to accurately represent division by 3, 7, 9, etc. In order to accommodate this structure, a rounding operation is also needed to guarantee an integer result. Given the large number of high precision divide operations, this implementation does not adequately address the complexity problem for large m and n, and further has the potential to produce an incorrect result due to accumulated errors in precision.

In yet another implementation, Eq. 5 can be rearranged in the following manner:

$$F(n,d) = \quad (7)$$
$$n \cdot (n-1) \cdot \left(\frac{1}{2}\right) \cdot (n-2) \cdot \left(\frac{1}{3}\right) \cdots (n-d+2) \cdot \left(\frac{1}{d-1}\right) \cdot (n-d+1) \cdot \left(\frac{1}{d}\right).$$

If this expression is evaluated from left to right, the result will always produce an integer value. While this method controls the precision and dynamic range issue to some degree, large values of m and n still require extensive use of multi-precision multiply and divide operations.

Finally, in order to minimize computational complexity, it may be possible to pre-compute and store all factorial combinations in a lookup table. Thus, all values of F(n,m) may be simply stored in an n×m matrix and appropriately retrieved from memory using very few processor cycles. The problem with this approach, however, is that as n and m become large, so does the associated memory requirement. Citing the previous example, F(144, 28) would require 144×28×⌈99 bits/8 bits/byte⌉=52,416 bytes of storage, which is unreasonable for most mobile handheld devices. Therefore, a need exists for a method and apparatus for low-complexity combinational Factorial Pulse Coding of vectors.

BRIEF DESCRIPTION OF THE DRAWINGS

FIG. 5 is a flow chart showing operation of the encoder of FIG. 1.
FIG. 6 is a flow chart showing operation of the decoder of FIG. 3.
FIG. 8 is a flow chart showing operation of the combinatorial decoding circuitry of FIG. 3.

DETAILED DESCRIPTION OF THE DRAWINGS

Figure 1:
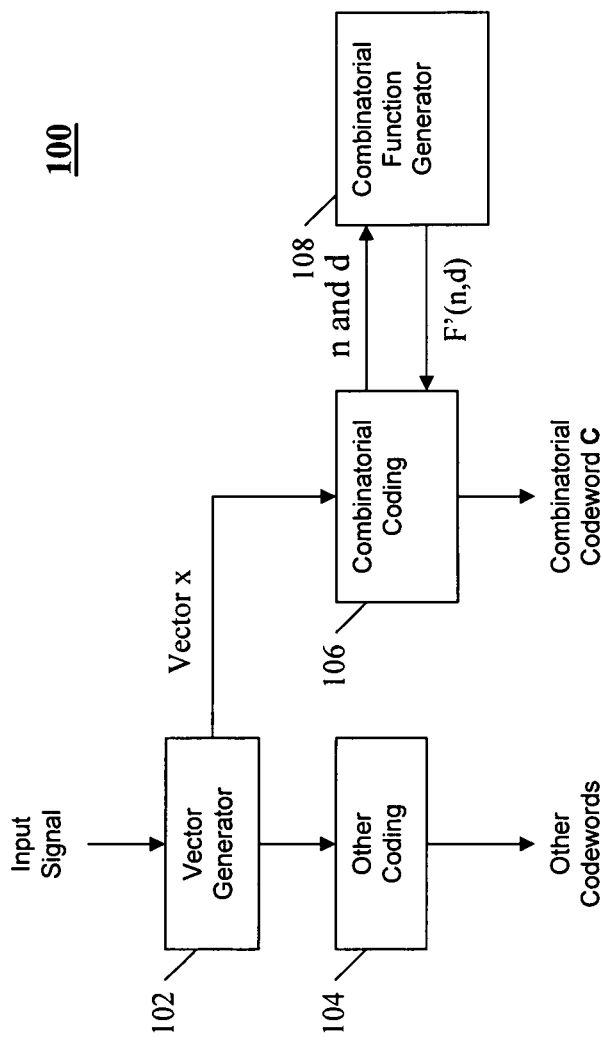
FIG. 1 is a block diagram of an encoder.

In order to address the above-mentioned need, a method and apparatus for low-complexity combinatorial coding of vectors is provided herein. During operation of an encoder, a signal vector (x) is received. A first multi-precision operand ($\Psi''_k$) will be generated based on the signal vector to be encoded. A mantissa operand and an exponent operand are generated. Both the mantissa operand and the exponent operand are representative of a second multi-precision operand that is based on the signal vector to be encoded. A portion of $\Psi''_k$ is selected to be modified based on the exponent operand. A part of $\Psi''_k$ is modified based on the mantissa operand to produce a modified multi-precision operand ($\Psi''_{k+1}$). Finally, a multi-precision codeword is generated for use in a corresponding decoder.

The present invention encompasses a method for operating an encoder that encodes a codeword (C) from a vector (x). The method comprises the steps of receiving the vector x to be encoded, generating a first multi-precision operand ($\Psi''_k$) based on x, and generating a mantissa operand (M) and an exponent operand (h). The mantissa operand and the exponent operand are representative of a second multi-precision operand (F'($p_k$,k)) that is based on the signal vector to be encoded. A portion of $\Psi''_k$ is then selected to be modified based on the exponent operand, and the portion of $\Psi''_k$ is modified based on the mantissa operand and location indicator to produce a modified multi-precision operand ($\Psi''_{k+1}$). Finally, the codeword (C) is generated based on $\Psi''_{k+1}$.

The present invention additionally encompasses an encoder comprising combinatorial coding circuitry performing the steps of receiving a vector x to be encoded, generating a first multi-precision operand ($\Psi''_k$) based on x, and generating a mantissa operand (M) and an exponent operand (h). The mantissa operand and the exponent operand are representative of a second multi-precision operand (F'($p_k$,k)) that is based on the signal vector to be encoded. A portion of $\Psi''_k$ is then selected to be modified based on the exponent operand, and the portion of $\Psi''_k$ is modified based on the mantissa operand and location indicator to produce a modified multi-precision operand ($\Psi''_{k+1}$). Finally, the codeword (C) is generated based on $\Psi''_{k+1}$.

The present invention additionally encompasses a method for operating a decoder that generates a vector (x) from a codeword (C). The method comprises the steps of receiving the codeword ($C_\pi$), generating a first multi-precision operand ($\Psi''_{k+1}$) based on $C_\pi$, and generating a mantissa operand (M) and an exponent operand (h). The mantissa operand and the exponent operand are representative of a second multi-precision operand (F'($p_k$,k)) that is based on the codeword. A portion of $\Psi''_{k+1}$ is selected to be modified based on the exponent operand and the portion of $\Psi''_{k+1}$ is modified based on the mantissa operand and location indicator to produce a modified multi-precision operand ($\Psi''_k$). A position $p_{k-1}$ of the (k−1)th non-zero elements of vector x is decoded and the vector (x) is generated based on the position $p_{k-1}$.

The present invention additionally encompasses a decoder comprising combinatorial coding circuitry performing the steps of receiving the codeword ($C_\pi$), generating a first multi-precision operand ($\Psi''_{k+1}$) based on $C_\pi$, and generating a mantissa operand (M) and an exponent operand (h). The mantissa operand and the exponent operand are representative of a second multi-precision operand (F'($p_k$,k)) that is based on the codeword. A portion of $\Psi''_{k+1}$ is selected to be modified based on the exponent operand and the portion of $\Psi''_{k+1}$ is modified based on the mantissa operand and location indicator to produce a modified multi-precision operand ($\Psi''_k$) A position $p_{k-1}$ of the (k−1)th non-zero elements of vector x is decoded and the vector (x) is generated based on the position $p_{k-1}$.

Turning now to the drawings, wherein like numerals designate like components, FIG. 1 is a block diagram of encoder 100. Encoder 100 comprises vector generator 102, combinational coding circuitry (coder) 106, combination function generator 108, and other coding circuitry 104. During operation, an input signal to be coded is received by vector generator 102. As is known in the art, the input signal may comprise such signals as speech, audio, image, video, and other signals.

Vector generator 102 receives the input signal and creates vector $x_i$. Vector generator 102 may comprise any number of encoding paradigms including, but not limited to, Code-Excited Linear Prediction (CELP) speech coding as described by Peng, et. al, transform domain coding for audio, images and video including Discrete Fourier Transform (DFT), Discrete Cosine Transform (DCT), and Modified Discrete Cosine Transform (MDCT) based methods, wavelet based transform coding, direct time domain pulse code modulation (PCM), differential PCM, adaptive differential PCM (AD-PCM), or any one of a family of sub-band coding techniques that are well known in the art. Virtually any signal vector of the form given above may be advantageously processed in accordance with the present invention.

Combinatorial coding circuitry 106 receives vector $x_i$ and uses Factorial Pulse Coding to produce a codeword C. As discussed above Factorial Pulse Coding can code a vector $x_i$ using a total of M bits, given that $m=\sum_{i=0}^{n-1}|x_i|$, and all values of vector $x_i$ are integral valued such that $-m \leq x_i \leq m$, where m is the total number of unit amplitude pulses, and n is the vector length. As discussed above, larger values of m and n can quickly cause problems, especially in mobile handheld devices which need to keep memory and computational complexity as low as possible.

In order to address this issue, combinatorial function generator 108 utilizes a low complexity technique for producing F'(n, d). Combinatorial coding circuitry 106 then utilizes F'(n, d) to produce codeword C. Circuitry 108 utilizes relatively low resolution approximations (bits of precision) of factorial combinations F'(n, d), which provide only enough precision to allow a valid codeword to be generated. That is, as long as certain properties are maintained, a suitable approximation of the function $F(n, d)$ is sufficient to guarantee that the resulting codeword is uniquely decodable.

In order to describe the generation of $F'(n, d)$, let us proceed by first deriving a function $F'(n, d)$ that is a suitable approximation of $F(n, d)$. The first step is to take the logarithm of an arbitrary base a of Eq. 5, and taking the inverse log base a of the rearranged terms:

$$F(n, d) = \exp_a\left(\sum_{i=n-d+1}^{n} \log_a(i) - \sum_{j=1}^{d} \log_a(j)\right), \quad (8)$$

where the function $\exp_a(k)=a^k$. Next, define functions $P(i)$, $Q(d)$, and $R(k)$, and substitute into Eq. 8 such that:

$$F(n, d) = R\left(\sum_{i=n-d+1}^{n} P(i) - Q(d)\right), \quad (9)$$

where $P(i)=\log_a(i)$, $Q(d)=\sum_{j=1}^{d} \log_a(j)$, and $R(k)=\exp_a(k)=a^k$. However, in accordance with the preferred embodiment of the present invention, it is not necessary for $F(n, d)$ and $F'(n, d)$ to be equivalent in order for the resulting codeword to be uniquely decodable. There are only two conditions that are sufficient for this to hold true:

$$F'(n, d) \geq F(n, d), \quad (10)$$

and $$F'(n, d) \geq F'(n-1, d) + F'(n-1, d-1). \quad (11)$$

For the first condition, the restriction simply says that if $F'(n, d)<F(n, d)$, then there will be overlapping code-spaces, and subsequently, there will be more than one input capable of generating a particular codeword; thus, the codeword is not uniquely decodable. The second condition states that the "error" for a given n, d shall be greater than or equal to the sum of the error terms associated with the previous element of the recursive relationship described by Peng, et. al in U.S. Pat. No. 6,236,960. It can be shown that $F(n, d)=F(n-1, d)+F(n-1, d-1)$, which is only true if the combinatorial expression is exactly equal to $F(n, d)=C_d^n=n!/d!(n-d)!$. However, while the inequality in Eq. 11 is sufficient, it may not necessarily be true for all values of n and d. For such values, $F(n,d)$ may satisfy another inequality derived from Eq. 31 of Peng, et al. and is given by:

$$F(n, d) > \sum_{i=1}^{d} F(n-(d-i+1), i). \quad (12)$$

In this case, Eq. 11 has to be satisfied with strict inequality for certain $(m,k)$, $(m\leq n)$, $(k\leq d)$, that is:

$$F(m, k)>F(m-1, k)+F(m-1, k-1), m\leq n, k\leq d. \quad (13)$$

Referring back to Eq. 9, we now wish to generate $F'(n, d)$ by creating the functions $P'(i)$, $Q'(d)$, and $R'(k)$, with low complexity approximations of the original functions such that:

$$F'(n, d) = R'\left(\sum_{i=n-d+1}^{n} P'(i) - Q'(d)\right), \quad (14)$$

and where the conditions given in Eqs. 10 and 11 are satisfied. Considering $P(i)$, we may wish to approximate the function such that $P'(i)\geq\log_a(i)$, $i \in [1, 2, \ldots, n]$. If we choose $a=2$ and then restrict $P'(i)$ to 32 bits of precision, the resulting operations are easy to implement on a handheld mobile device since most DSPs support single cycle 32 bit additions. Therefore, we define:

$$P'(i)=2^{-l(i)}\lfloor 2^{l(i)}\log_2(i)+1 \rfloor, i \in[1, 2, \ldots, n], \quad (15)$$

where $l(i)$ is a shift factor that may vary as a function of i. In the preferred embodiment, $l(i)=l=21$, but many other sets of values are possible. For this example, the $2^l$ factor is equivalent to a shift of l bits to the left, whereby the floor function $\lfloor x+1 \rfloor$ removes the fractional bits while rounding up to the next highest integer, and finally the $2^{-l}$ factor shifts the results back to the right by l bits. Using this methodology, the function $P'(i)\geq\log_2(i)$ for all $i\geq 1$, and also provides sufficient dynamic range and precision using only 32 bits because 9 bits of positive integer resolution in the $\log_2$ domain can represent a 512 bit number. To avoid the complexity of computing these values in real-time, they can be pre-computed and stored in a table using only 144×4 bytes of memory for the $F(144, 28)$ example. Using a similar methodology for approximating $Q(d)$, we get:

$$Q'(d) = \begin{cases} 0, & d = 1 \\ \sum_{j=2}^{d} 2^{-l(j)}\lfloor 2^{l(j)}\log_2(j) - 1 \rfloor, & d \in [2, \ldots, m], \end{cases} \quad (16)$$

where the floor function $\lfloor x-1 \rfloor$ is used because of the subtraction of the quantity from the total. This guarantees that $Q'(d) \leq \sum_{j=1}^{d}\log_2(j)$ so that the contribution of $Q'(d)$ will guarantee $F'(n, d)\geq F(n, d)$. While $l(j)$ can assume many values depending on the configuration of m and n, the preferred embodiment uses a value of $l(j)=l=14$ for the variable shift factor. Like $P'(i)$, $Q'(d)$ can be pre-computed and stored in a table using only 28×4 bytes of memory for the $F(144, 28)$ example. For defining $R'(k)$, we need to first define k as:

$$k = \sum_{i=n-d+1}^{n} P'(i) - Q'(d). \quad (17)$$

With $P'(i)$ and $Q'(d)$ defined above, k is preferably a 32 bit number with an 8 bit unsigned integer component $k_i$ and a 24 bit fractional component $k_f$. Using this, we may derive $R'(k)\geq\exp_2(k)=2^k$ by letting $k=k_i+k_f$ and then taking the inverse logarithm base 2 to yield $2^k=2^{k_i}2^{k_f}$. We may then use a Taylor series expansion to estimate the fractional component to the desired precision, represented by $K_f=2^{k_f}$, rounding up the result using the ceiling function, and then appropriately shifting the result to form a multi-precision result (with only l significant bits), such that:

$$R'(k)=2^{k_i-l}\lceil 2^l K_f \rceil, \quad (18)$$

where $2^{k_i}$ is the integer shift factor applied to the Taylor series expansion result. Here, l is a shift factor used in a similar manner to Eqs. 15 and 16 to guarantee $R'(k)\geq 2^k$. However, since R'(k) cannot be practically pre-computed for efficient real-time operation, great care must be taken in specifying the exact operations necessary in both the encoder and decoder to ensure that the reconstructed signal vector matches the input signal vector exactly. Note that R'(k) may be obtained from left shifting $\lceil 2^l K_f \rceil$, which can be accurately represented by l bits.

In the above discussion, functions P'(i), Q'(d), and R'(k) have been chosen such that each individual function estimate guarantees that the resulting F'(n, d)≥F(n, d). However, it is only necessary for the aggregate effect to satisfy this condition. For example, P'(i) and Q'(d) may be as described above, but R'(k) may be a more conventional R'(k)≈$2^k$ function which may truncate or round the least significant bits such that R'(k) may be less than $2^k$ for some values of k. This is acceptable as long as this effect is small relative to the effects of P'(i) and Q'(d), so the properties in Eqs. 10 and 11 still hold true.

Also, any functions P'(i), Q'(d), and R'(k) may be used without loss of generality as long as the properties on Eqs. 10 and 11 are satisfied. Care must be taken however, that an increase in bit rate may occur if too little precision is used. It should also be noted that there is an inherent tradeoff in bit rate and complexity, and for large values of m, n, an increase of 1 or 2 bits may be a reasonable tradeoff for a significant reduction in complexity.

The formulation of the partial codeword C, for position and magnitudes, in combinatorial coding circuitry 106 is now described. Let $\pi=\{p_1, p_2, \ldots, p_\nu\}$ be the non-zero pulse positions (in increasing order) and $\mu=\{m_1, m_2, \ldots, m_\nu\}$ m be the magnitudes at respective positions within a vector x. The code for pulse positions is given by:

$$C_\pi = \sum_{k=1}^{\nu} F'(p_k, k) \quad 0 \le p_k < n, \quad (19)$$

and the code for pulse magnitudes is given by:

$$C_\mu = \sum_{k=1}^{\nu-1} F'\left(\sum_{j=1}^{k} m_j - 1, k\right) \quad 1 \le \sum_{j=1}^{k} m_j, m_k < m. \quad (20)$$

Thus, the formulation of these codeword requires addition of $\nu$ and $\nu-1$ multi-precision numbers. Similar subtraction operations are needed in the decoder. These operations also add to the complexity of the FPC method when n and m are large. Consider encoding/decoding of an audio signal for a multi-layer embedded coding system. This technique is used for encoding the transform of the residual error signal in the three layers of the multi-layer system. Let the size of a 20 ms block is n=280 and is the same for all the layers. The number of the pulses for encoding depends on the bit-rate of each layer. If each layer is 8 kbps, 16 kbps, or 32 kbps then they need 160 bits, 320 bits, and 640 bits for coding of 20 ms block, respectively. Using the FPC technique a block of length 280 can be coded using 28, 74, and 230 pulses for 160 bits, 320 bits, and 640 bits per layer, respectively. The multi-precision operations in equations (19) and (20) are performed on a digital signal processor which typically operates on 16-bit words. Thus, for formation of 160 bit codeword, addition operations are needed to be performed over 10 words and for 640 bit codeword the addition operation are to be performed over 40 words. Each addition operation takes 4 units (generation of carry, move to array, add with carry). Hence encoding/decoding of k-bit codeword in p-layers of a multi-layer system requires 400·p·⌈k/16⌉·(2m−3) operations/sec. For various values of n, m, and p the complexity of the multi-precision addition/subtraction operations is shown in Table 1. In this table, WMOPS stands for Weighted Millions of Operation Per Second.

TABLE 1

Complexity of addition/subtraction in the FPC Encoding/Decoding using a Prior Art Method

| Number of Layers (p) | Block Size (n) | Layer Bit Rate/Bits per 20 ms block (k) | Number of Pulses (m) | Complexity of Multi-precision addition/subtraction |
|---|---|---|---|---|
| 3 | 280 | 8 kbps/160 | 28 | 0.64 WMOPs |
| 3 | 280 | 16 kbps/320 | 74 | 3.48 WMOPs |
| 3 | 280 | 32 kbps/640 | 230 | 22.0 WMOPs |

From Table 1, we note that when the bit rate doubles, the complexity of the multi-precision addition increases six times.

As mentioned before, the combinatorial function is replaced by an approximate function F'(n, r) which is given as:

$$F'(n, r) = R\left(\sum_{i=n-r+1}^{n} P'(i) - Q'(r)\right), \quad (21)$$

where $$Q'(r) = \begin{cases} 0, & r = 1 \\ \sum_{j=2}^{r} 2^{-l_Q} \lfloor 2^{l_Q} \log_2(j) - 1 \rfloor, & r > 1, \end{cases} \quad (22)$$

and R'(k) is an approximation of the function R'(k)≈$2^k$, given as:

$$R'(k) = \lfloor 2^{k_i - l_R} \lfloor 2^{l_R} K_f \rfloor \rfloor, \quad (23)$$

where k=$k_i$+$k_f$ is broken down into integer and fractional components of k, and $K_f$=$2^{k_f}$ is a low resolution Taylor series expansion of the fractional component of k. Based on the above pre-defined functions Q'(r) and R'(k), P'(i) are first obtained so that the unique decodability inequality $$F'(n, d) > F'(n-1, d) + F'(n-1, d-1) \quad (24)$$

is satisfied for all values of n and d.

Going back to equations (19) and (20), replacing approximate functions F' in place of actual functions F yields:

$$C_\pi = \sum_{k=1}^{\nu} F'(p_k, k) \quad 0 \le p_k < n, \quad (25)$$

$$C_\mu = \sum_{k=1}^{\nu-1} F'\left(\sum_{j=1}^{k} m_j - 1, k\right) \quad 1 \le \sum_{j=1}^{k} m_j, m_k < m. \quad (26)$$

The binary representation F'(n, r) obtained in equation (23) has $k_i - l_R$ terminating zeros if k>$l_R$. F'(n, r) was obtained as a multi-precision number by left shifting (h=$k_i - l_R$ shifts) an $l_R$-bit number. Since the trailing h bits of F'($p_k$, k) are zero, those trailing h bits of the codeword will not be affected when we add F'($p_k$, k) to the existing partial sum in equation (25). To efficiently use this property, F'($p_k$, k) is computed in a pseudo floating point format, i.e., the function R'(k) outputs an $l_R$-bit mantissa (M) and a corresponding non-negative exponent (h). The $l_R$-bit mantissa (M) is defined as:

$$M \approx \lfloor 2^{min(l_R,k_i)} \cdot 2^{k_j} \rfloor, \quad (27)$$

and the exponent h is defined as:

$$h = min(0, k_i - l_R) \quad (28)$$

Now the summation in equations (25) and (26) can easily use the fact that $\lfloor h/16 \rfloor$ words are not affected when F'($p_k$, k) is added to the partial sum.

The above method does decrease some complexity. However, still the carry generated during the operation may have to be propagated till the end of the codeword. In the subsequence, we will show that if F'(k, r) satisfy certain properties then carry has to be propagated to a much smaller part of the whole codeword.

First we will explore that the carry will be propagated to one extra word if exact combinatorial functions F($p_k$, k) are to be added (as in equation (19)) and the summation is calculated in increasing order of k:

$$C_\pi = (((F(p_1,1) + F(p_2,2)) + F(p_3,3)) + \ldots) + F(p_v, v), \quad (29)$$

i.e., the partial sum $\Psi_k$ to which F($p_k$, k) is added is given by:

$$\Psi_k = \sum_{i=1}^{k-1} F(p_i, i). \quad (30)$$

It can be shown that the multi-precision operand $\Psi_k$ is less than F($p_k$, k−1). The maximum ratio of $\Psi_k$ to F($p_k$, k) is less than k/($p_k$−k+1). The above ratio is infinity when k=$p_k$+1, which is also the maximum possible value of k. Since F($p_k$, $p_k$+1)=0, the carry need not be propagated in this particular case. For other values of k, this ratio is not greater than smaller of n and m. Thus $$\Psi_k + F(p_k, k) < (min(m, n) + 1) F(p_k, k), k \leq p_k \quad (31)$$

Since min(m, n) is less 32768 hence the above summation will not propagate the carry more than one extra word. This suggests that if we use exact combinatorial functions in the ordered summation (29), then we get the benefit of propagating the carry to only one extra word, however exact combinatorial function do not have the advantage of trailing zeros and hence addition is performed over the length of F($p_k$, k).

Clearly we will like to design approximate functions F'($p_k$, k) so that in addition to having unique decodability and trailing zeros; the ordered summation of F'($p_k$, k) in equation (29) does not require carry propagation. It can be shown that the partial sum (a first multi-precision codeword) to which F'($p_k$, k) is added, is given by:

$$\Psi'_k = \sum_{i=1}^{k-1} F'(p_i, i), \quad (32)$$

which is less than F'($p_k$, k−1). Hence, the inequality $$F'(p_k, k-1) < 32768 \cdot F'(p_k, k), \quad (33)$$

suffices that when F'($p_k$, k) is added to $\Psi'_k$ to generate $\Psi'_{k+1}$ (a modified multi-precision codeword), $$\Psi'_{k+1} = \Psi'_k + F'(p_k, k), \quad (34)$$

a carry needs to be propagated to only one extra word. This has been empirically determined for F'(n, r), defined by equations (21), (22) and (23). Besides the unique decodabiltiy inequality, we also need to satisfy the partial sum inequality, i.e., $$\Psi'_k < 32768 \cdot F'(p_k, k). \quad (35)$$

It can be shown that if the unique decodability inequality holds for n<$p_k$ then $$\Psi'_k < F'(p_k-1, k-1) + F'(p_k-1, k-2). \quad (36)$$

Thus, it is sufficient to generate P'(i) which satisfy:

$$32768 \cdot F'(p_k, k) > F'(p_k-1, k-1) + F'(p_k-1, k-2) \quad (37)$$

Now the approximate combinatorial functions F' satisfy

1. Unique decidability inequality
2. Trailing zeros property
3. Partial sum inequality Hence, these functions can be used in construction of a factorial packing codeword by modifying only a very small subset (only 3 words out of 10, 20, or 30 words) of the complete multi-precision codeword. The small subset is represented by a location indicator defined by integers $w_l$ and $w_u$ that identifies the words in the multi-precision codeword which are to be modified. The location indicator is computed as follows:

$$w_l = \left\lfloor \frac{h}{16} \right\rfloor, w_u = \left\lfloor \frac{h + l_R}{16} \right\rfloor + 1, \quad (38)$$

where 16 is a word length and $l_R$=16 is chosen as the length of the mantissa. The words $w_l$ to $w_u$ of the multi-precision codeword ($C_\pi$) are modified based on the mantissa M. Note that the multi-precision codeword $$C_\pi = \Psi'_{v+1}. \quad (39)$$

The decoder involves subtraction of F'($p_k$, k) from $\Psi'_{k+1} = \Psi'_k + F'(p_k, k)$. Using similar arguments as we did for summation, it can be shown that if functions F' satisfy the three above defined properties, then during decoding also only a very small subset of the complete codeword will need modification. In the decoder $p_{k-1}$ is obtained as:

$$p_{k-1} = max(p) \text{ s.t. } F'(p, k-1) \leq \Psi'_k \quad (40)$$

The complexity of encoding/decoding the positions and magnitudes using a prior art method was shown in Table 1 (Complexity shown was only for the summation and subtraction part. The complexity does not include complexity of generation of F'). Using the proposed method for encoding/decoding in the 3-layers of a multi-layer embedded system results is significant decrease in multi-precision addition/subtraction complexity. The corresponding complexity numbers when we used the current invention are shown in Table 2. Note that the complexity improvement is more when more pulses (longer codeword size) are used in encoding.

TABLE 2

Complexity of addition/subtraction in the FPC Encoding/Decoding using the Current Invention

| Number of Layers (p) | Block Size (n) | Layer Bit Rate/Bits per 20 ms block (k) | Number of Pulses (m) | Complexity of Multi-precision addition/subtraction |
|---|---|---|---|---|
| 3 | 280 | 8 kbps/160 | 28 | 0.21 WMOPs |
| 3 | 280 | 16 kbps/320 | 74 | 0.53 WMOPs |
| 3 | 280 | 32 bbps/640 | 230 | 1.65 WMOPs |

Encoding of Number of Non-Zero Positions:

The $l_R$-bit mantissa and exponent representation format also have advantages in coding of the number of non-zero positions. The encoding of number of number of non-zero positions v is given by $$C_v = \sum_{k=v+1}^{n} F'(n, k)F'(m-1, k-1)2^k \quad (41)$$

It can be easily seen that the multiplication of two approximate functions can be much easier in the mantissa and exponent format than in the multi-precision format. The main advantage however is when we want to reduce the complexity then using the $l_R$-bit mantissa and exponent representation, each of the F'(n, k) and F'(m−1, k−1) can be pre-stores using only two words (product of their $l_R$-bit mantissa and sum of their exponent can also be pre-stored). This enables faster encoding of v without any significant ROM requirement.

During operation of encoder 100, combinatorial coding circuitry 106 will receiving a signal vector (x) to be encoded. A first multi-precision operand ($\Psi'_k$) will be generated based on the signal vector to be encoded. More particularly, $$\Psi'_k = \sum_{i=1}^{k-1} F'(p_i, i),$$

where $p_i$ are the positions of the non-zero elements of vector x. A mantissa operand ($M \approx \lfloor 2^{k_f} \cdot 2^{min(k_i, l_R)} \rfloor$) and an exponent operand ($h = min(0, k_i - l_R)$) are generated. Both the mantissa operand and the exponent operand are representative of a second multi-precision operand (F'($p_k$, k)) that is based on the signal vector to be encoded. Circuitry 106 then selects a portion of $\Psi'_k$ to be modified based on the exponent operand. As discussed above, the portion is represented by a location indicator defined by integers $w_l$ and $w_u$ that identifies the words in the multi-precision codeword which are to be modified. The location indicator is computed as shown in equation (38). A part of $\Psi'_k$ is then modified based on the mantissa operand and location indicator to produce a modified multi-precision operand ($\Psi'_{k+1}$) as in equation (34), and a multi-precision codeword is generated for use in a corresponding decoder, based on the modified multi-precision operand as shown in equation (39).

Figure 2:
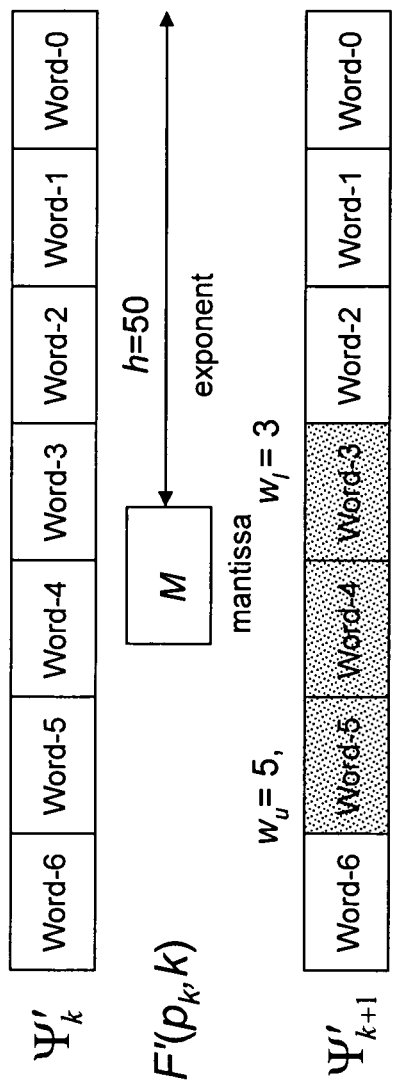
FIG. 2 illustrates the generation of a code word.

FIG. 2 illustrates one example of the generation of a code word via the above technique. As described above, $$\Psi'_k = \sum_{i=1}^{k-1} F'(p_i, i).$$

As shown in FIG. 2, only words 3, 4, and 5 of the multi-precision codeword are modified when going from $\Psi'_k$ to $\Psi'_{k+1}$. The particular words that are chosen to be modified are $w_l$ to $w_u$ words from multi-precision codeword $C_\pi$, with $w_l$ and $w_u$ based on the exponent h=50, such that $$w_l = \lfloor h/16 \rfloor = 3,$$

$$w_u = \lfloor (h+l_R)/16 \rfloor + 1 = 5$$

The $w_l$ word of $\Psi'_k$ is modified by adding a left-shifted h−16× $w_l$ lowest significant bits of mantissa M. The $w_l$+1 to $w_u$−1 words are modified by adding subsequent 16-bits of mantissa M. Each of these addition involves add with a carry and a carry out is generated for the next stage. The $w_u$ word is modified by adding only the carry out from the previous addition. Note that since $l_R$=16, $w_u$=$w_l$+2. In case of the decoder subtractions are performed instead of additions.

Figure 3:
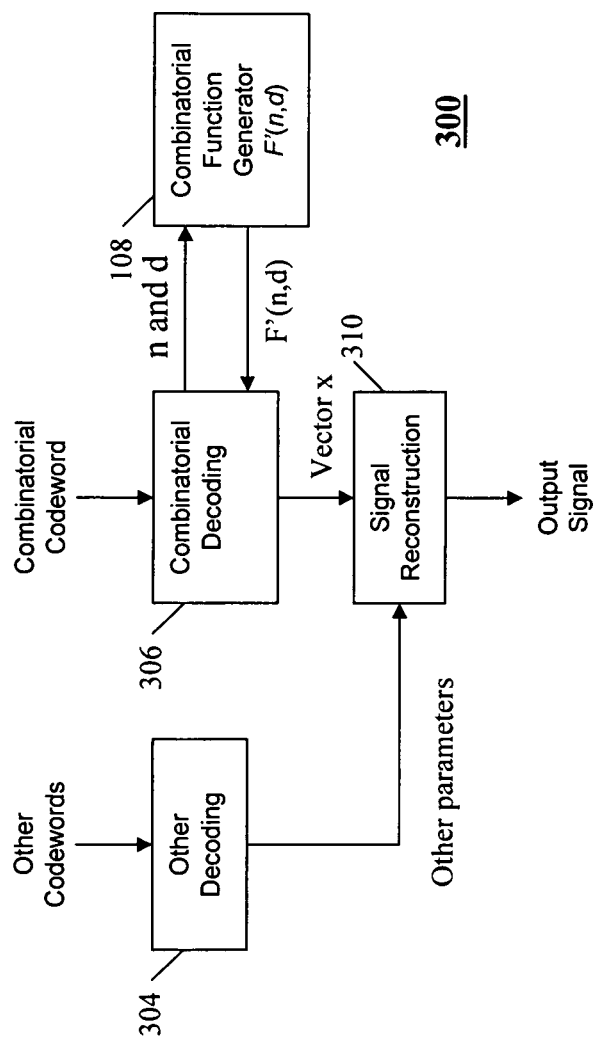
FIG. 3 is a block diagram of a decoder.

FIG. 3 is a block diagram of decoder 300. As shown, decoder 300 comprises combinatorial decoding circuitry 306, signal reconstruction circuitry 310, other decoding circuitry 304, and combinatorial function generator 108. During operation a combinatorial codeword is received by combinatorial decoding circuitry 306. Combinatorial decoding circuitry 306 provides n and d to combinatorial function generator, and receives F'(n, d) in response. Decoding circuitry 306 then creates vector $x_i$ based on F'(n, d). Circuitry 306 operates in a similar manner as circuitry 106, except subtraction replaces addition operations. In other words, $\Psi'_k = \Psi'_{k+1} - F'(p_k, k)$. Vector $x_i$ is passed to signal reconstruction circuitry 310 where the output signal (e.g., speech, audio, image, video, or other signals) is created based on $x_i$ and other parameters from other decoding circuitry 304. More specifically, the other parameters may include any number of signal reconstruction parameters associated with the signal coding paradigm being used in a particular embodiment. These may include, but are not limited to, signal scaling and energy parameters, and spectral shaping and/or synthesis filter parameters. Normally these parameters are used to scale the energy of and/or spectrally shape the reconstructed signal vector $x_i$ in such a manner as to reproduce the final output signal.

Figure 4:
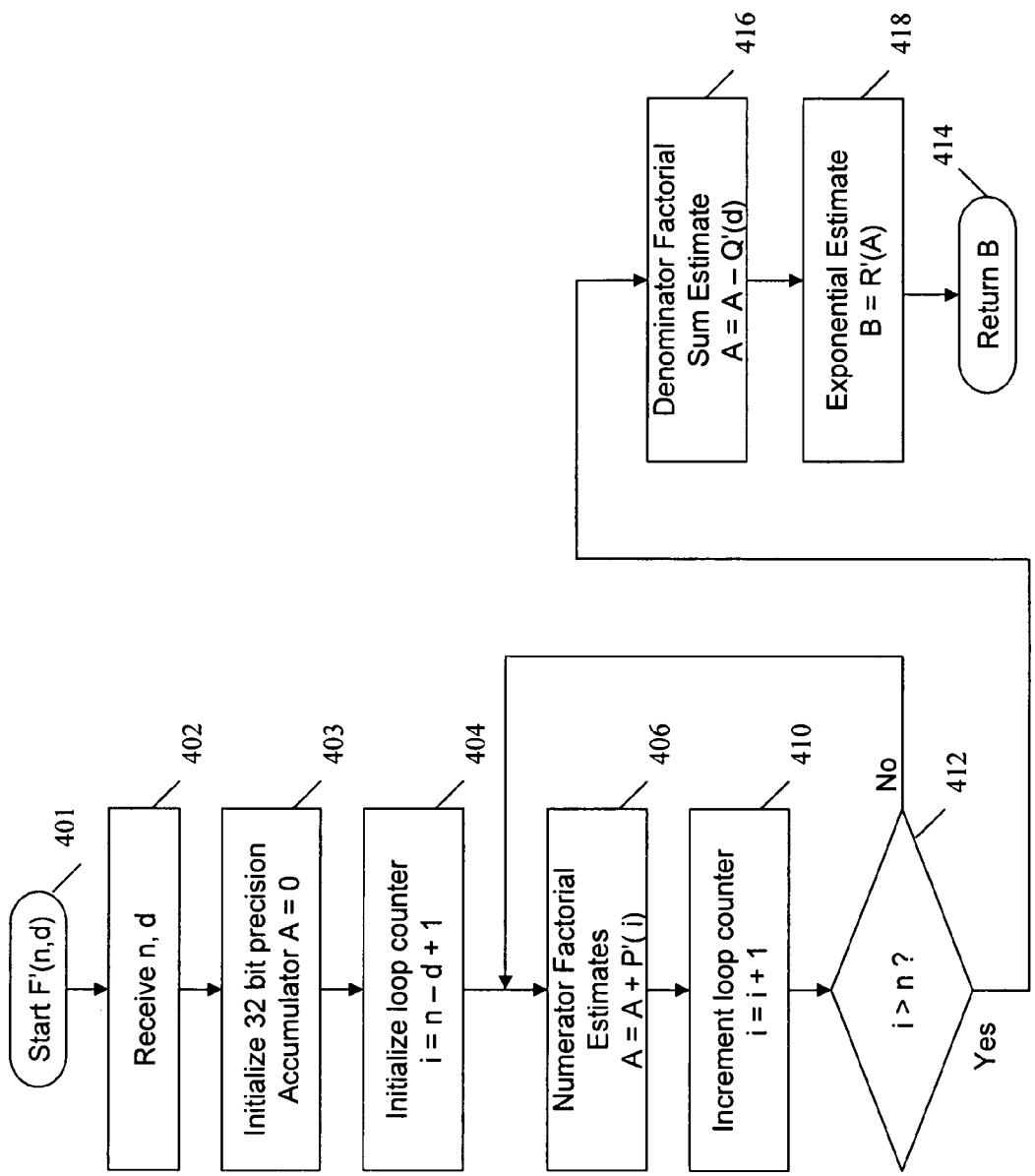
FIG. 4 is a flow chart showing operation of a Combinatorial Function Generator of FIG. 1 and FIG. 3.

FIG. 4 is a flow chart showing operation of a combinatorial function generator of FIG. 1 and FIG. 3. More particularly, the logic flow of FIG. 4 shows those steps necessary for combinatorial function generator 108 to produce F'(n, d). The logic flow begins at step 402 where the inputs n and d are received. At step 403 accumulator A is set to 0. At step 404 the counter i is set equal to n−d+1. At step 406 logarithm approximation P'(i) is added to the accumulator A. At step 410 counter i is incremented by 1. Steps 406 and 410 are repeated in a loop until the counter i is greater than n. Step 412 tests i>n and terminates the loop when i becomes greater than n. At this stage the accumulator contains the logarithm approximate of the numerator of the combinatorial function F(n, d). A logarithm approximation of the denominator of the combinatorial function Q'(d) is subtracted from the accumulator at step 416 to obtain a logarithm approximation of the combinatorial function. At step 418 an exponential approximation R'(A) of the accumulator is taken to generate the approximation B of the combinatorial function. At step 414, B is outputted as F'(n, d).

FIG. 5 is a flow chart showing operation of the encoder of FIG. 1. The logic flow begins at step 501 where an input signal is received by vector generator 102. As discussed above, the input signal may comprise speech, audio, image, video, or other signals. At step 503 vector $x_i$ is produced and input into combinatorial coding circuitry 106 where m and d are determined and passed to combinatorial function generator 108. As discussed above, m is the total number of unit amplitude pulses (or sum of the absolute values of the integral valued components of $x_i$) and d is the number non-zero vector elements of $x_i$. At step 505 F'(n, d) is created by combinatorial function generator 108 and passed to combinatorial coding circuitry 106, where vector $x_i$ is coded to create combinatorial codeword C (step 507). As discussed above, F'(n, d) is created by replacing the functions P(i), Q(d), and R(k) in F(n, d), with low complexity approximations of the original functions such that the conditions given in Equations 10 and 11 are satisfied.

FIG. 6 is a flow chart showing operation of the decoder of FIG. 3. The logic flow begins at step 601 where a combinatorial codeword is received by combinatorial decoder 306. At step 603 n and d are passed from combinatorial decoder 306 to combinatorial function generator 108 and F'(n, d) is returned to decoder 306 (step 605). The codeword is decoded by decoder 306 based on F'(n, d) (step 607) to produce vector $x_i$ and $x_i$ is passed to signal reconstruction circuitry 310 where an output signal is created (step 609).

Figure 7:
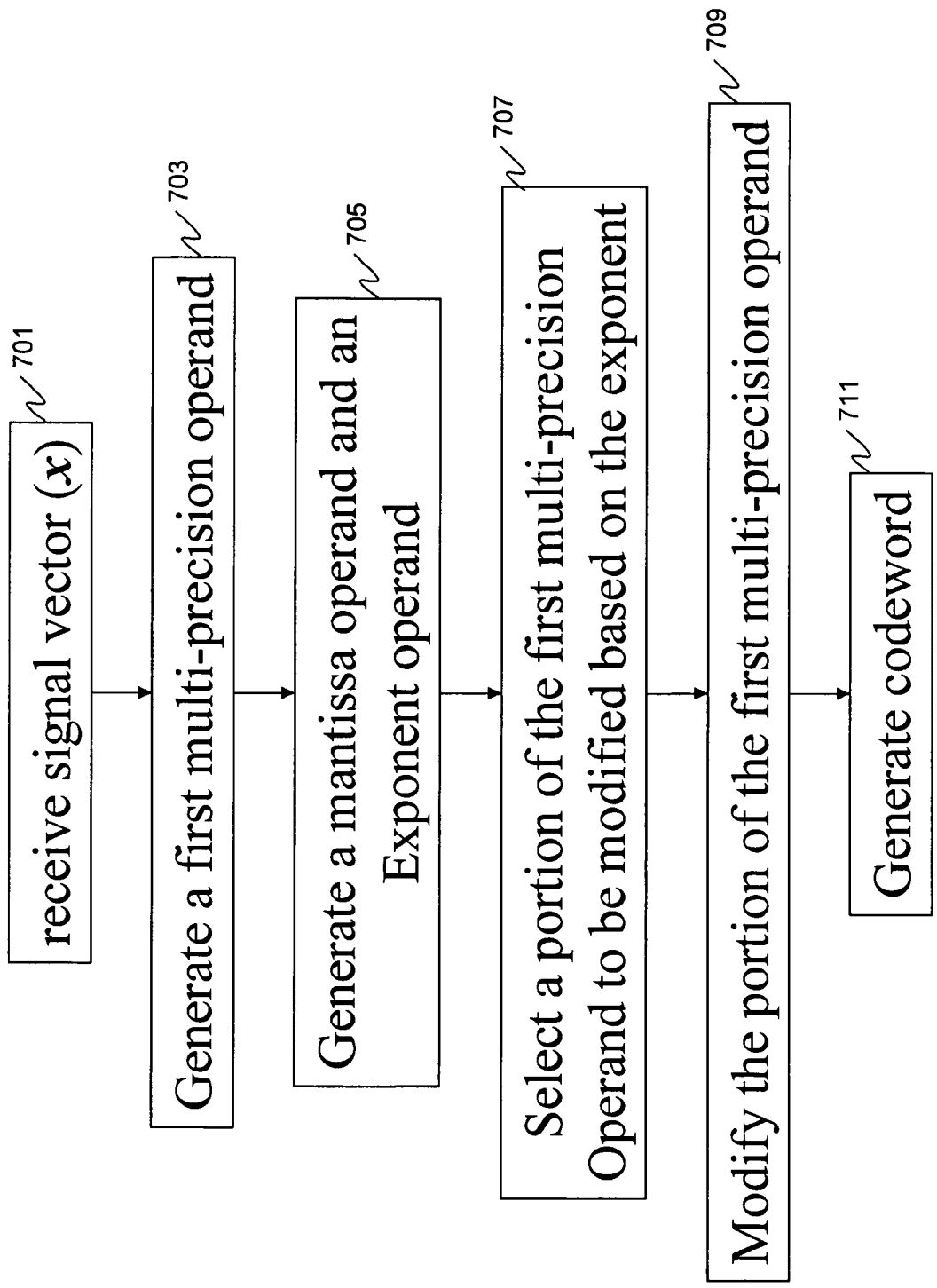
FIG. 7 is a flow chart showing operation of combinatorial coding circuitry of FIG. 1.

FIG. 7 is a flow chart showing operation of combinatorial coding circuitry 106. The logic flow begins at step 701 where a signal vector (x) is received. A first multi-precision operand ($\Psi'_k$) will be generated (step 703) based on the signal vector to be encoded. More particularly, $$\Psi'_k = \sum_{i=1}^{k-1} F'(p_i, i),$$

where $p_i$ are the positions of the non-zero elements of vector x. A mantissa operand ($M \approx \lfloor 2^{k_f} \cdot 2^{min(k_i,l_R)} \rfloor$) and an exponent operand ($h = min(0, k_i-l_R)$) are generated (step 705). Both the mantissa operand and the exponent operand are representative of a second multi-precision operand (F'($p_k$,k)) that is based on the signal vector to be encoded. Circuitry 106 then selects a portion of $\Psi'_k$ to be modified based on the exponent operand (step 707). As discussed above, the portion is represented by a location indicator defined by integers $w_l$ and $w_u$ that identifies the words in the multi-precision codeword which are to be modified. The location indicator is computed as shown in equation (38). At step 709, a part of $\Psi'_k$ is modified based on the mantissa operand and location indicator to produce a modified multi-precision operand ($\Psi'_{k+1}$) as in equation (34), and at step 711, a multi-precision codeword is generated for use in a corresponding decoder, based on the modified multi-precision operand as shown in equation (39).

FIG. 8 is a flow chart showing operation of combinatorial decoding circuitry 306. The logic flow begins at step 801 where the codeword ($C_\pi$) is received. A first multi-precision operand ($\Psi'_{k+1}$) will be generated (step 803) based on the received codeword. More particularly, $$\Psi'_{k+1} = C_\pi - \sum_{i=k+1}^{v} F'(p_i, i),$$

where $p_i$ are the decoded positions of the non-zero elements of the encoded vector x. A mantissa operand ($M \approx \lfloor 2^{k_f} \cdot 2^{min(k_i,l_R)} \rfloor$) and an exponent operand (h=min(0, $k_i-l_R$)) are generated (step 805). Both the mantissa operand and the exponent operand are representative of a second multi-precision operand (F'($p_k$,k)) that is based on the codeword. Circuitry 306 then selects a portion of $\Psi'_{k+1}$ to be modified based on the exponent operand (step 807). As discussed above, the portion is represented by a location indicator defined by integers $w_l$ and $w_u$ that identifies the words in the multi-precision codeword which are to be modified. The location indicator is computed as shown in equation (38). At step 809, a portion of $\Psi'_{k+1}$ is modified based on the mantissa operand and location indicator to produce a modified multi-precision operand ($\Psi'_k$) as $\Psi'_k = \Psi'_{k+1} - F'(p_k, k)$, and at step 811, a position $p_{k-1}$ of the (k−1)th non-zero elements of vector x is decoded, based on the modified multi-precision codeword as in equation (40). At step 813, a decoded vector x is generated based on the decoded position $p_{k-1}$.

Table 1 shows the complexity reduction associated with the present invention as compared to the prior art. For different values of m and n, the associated number of bits M and average number of function calls per frame to F(n, m) are given. For these examples, the frame length interval is 20 ms, which corresponds to a rate of 50 frames per second. The unit of measure for the complexity comparison is weighted millions of operations per second, or WMOPS. A computer simulation was used to produce an estimate of the complexity as it would be executed on a limited precision fixed point DSP. For these examples, multi-precision libraries were used when appropriate, and each primitive instruction was assigned an appropriate weighting. For example, multiplies and additions, were given a weight of one operation, while primitive divide and transcendental (e.g., $2^x$) operations were given a weight of 25 operations. From the table, it is easy to see that using F'(n, d) provides significant complexity reduction over the prior art, and that the proportional reduction in complexity increases and n and m increase. This complexity reduction is shown to be as high as two orders of magnitude for the F(144, 60) case, but would continue to grow as n and m increase further. This is primarily due to the growth in precision of the operands that is required to carry out exact combinatorial expressions in the prior art. These operations prove to result in an excessive complexity burden and virtually eliminate factorial pulse coding as a method for coding vectors having the potential for large m and n. The invention solves these problems by requiring only single cycle low precision operations coupled with a small amount of memory storage to produce estimates of the complex combinatorial expressions required for this type of coding.

TABLE 3

Complexity Comparison of F(n, m) vs. F'(n, m)

| n | m | Bits | Avg Calls per frame F(n, m) | Prior Art F(n, m) | | Invention F'(n, m) | |
|---|---|------|------------------------------|-------------------|---|--------------------|---|
|   |   |      |                              | Peak WMOPS | Avg WMOPS | Peak WMOPS | Avg WMOPS |
| 54  | 7  | 35  | 44  | 0.44   | 0.32  | 0.09 | 0.07 |
| 144 | 28 | 131 | 191 | 24.50  | 16.45 | 0.51 | 0.37 |
| 144 | 44 | 180 | 279 | 76.45  | 46.65 | 0.96 | 0.64 |
| 144 | 60 | 220 | 347 | 150.00 | 83.25 | 1.50 | 0.90 |

The following text and equations implement the above technique for coding and decoding into the Third Generation Partnership Project 2 (3GPP2) C.P0014-C specification for Enhanced Variable Rate Codec, Speech Service Options 3, 68, and 70 for Wideband Spread Spectrum Digital Systems.

4.13.5 MDCT Residual Line Spectrum Quantization

The MDCT coefficients, referred to as the residual line spectrum, are quantized in a similar manner to the FCB factorial codebook of 4.11.8.3. Basically, factorial coding of $N={}^n FPC_m$ possible combinations can be achieved given that the length n vector v has the properties $m=\Sigma_{i=0}^{n-1}|v_i|$ and all elements $v_i$ are integral valued. That is, the sum of the absolute value of the integer elements of v is equal to m. For this case, we wish to code an energy scaled version of $X_k$ such that:

$$m = \sum_{k=0}^{143} |\text{round}\{\gamma_m X_k\}|, \quad (4.13.5\text{-}1)$$

where $\gamma_m$ is a global scale factor, and the range 0 to 143 corresponds to the frequency range 0 to 3600 Hz. For this case, m can be either 28 for NB or 23 for WB inputs. The value of $\gamma_m$ used to achieve the above objective is determined iteratively (for non-zero $\|X_k\|^2$) according to the following pseudocode:

```
/* Initialization */
e_min = -100, e_max = 20 e = max{e_min, -10log_10(||X_k||^2)/1.2} s = +1, Δ_e = 8
/* main loop */
do {
    γ_m = 10^(e/20)

m' = Σ_{k=0}^{143} |round {γ_m X_k}| if (m' == m)              then break
    else if (m' > m and s == +1)   then s = -1, Δ_e = Δ_e/2
    else if (m' < m and s == -1)   then s = +1, Δ_e = Δ_e/2
    end e = e + s · Δ_e
} while e ≤ e_max and Δ_e ≥ Δ_min
```

The quantized residual line spectrum $X_{cc}$ is then calculated as:

$$X_{cc}(k) = \begin{cases} \text{round }\{\gamma_m X_k\}; & 0 \le k < 144 \\ 0; & 144 \le k < 160 \end{cases}, \quad (4.13.5\text{-}2)$$

If, on the rare occasion, the values of m and m' are different, the line spectrum shall be modified by adding or subtracting unit values to the quantized line spectrum $X_{cc}$. This guarantees that the resulting line spectrum can be reliably coded using the factorial coding method. The output index representing the line spectrum $X_{cc}$ is designated RLSIDX. This index comprises 131 bits for the $^{144}FPC_{28}$ case and 114 bits for the $^{144}FPC_{23}$ case.

In order to address complexity issues associated with encoding and decoding vector $X_{cc}$, a low resolution combinatorial approximation function F'(n, r) shall be used in place of the standard combinatorial relation $F(n, r) = {}^n C_r = n!/r!(n-r)!$. In particular, both the encoder and decoder utilize a combinatorial function generator F'(n, r) having the properties $F'(n, r) \ge F(n, r)$ and $F'(n, r) \ge F'(n-1, r) + F'(n-1, r-1)$, which are sufficient to uniquely encode/decode vector $X_{cc}$. The function F'(n, r) is given as:

$$F'(n, r) = R'\left(\sum_{i=n-r+1}^{n} P'(i) - Q'(r)\right), \quad (4.13.5\text{-}3)$$

where P'(i) and Q'(r) are 32 bit lookup tables given as:

$$P'(i) = 2^{-21}\lfloor 2^{21}\log_2(i)+1 \rfloor, \; i \in [1, 2, \ldots, 144], \quad (4.13.5\text{-}4)$$

and $$Q'(r) = \begin{cases} 0, & r = 1 \\ \sum_{j=2}^{r} 2^{-14}\lfloor 2^{14}\log_2(j)-1 \rfloor, & r \in [2, \ldots, 28] \end{cases}; \quad (4.13.5\text{-}5)$$

and where R'(k) is a multi-precision integer approximation of the function $R'(k) \approx 2^k$, given as:

$$R'(k) = \lfloor 2^{k_i-19}\lfloor 2^{19} K_f \rfloor \rfloor, \quad (4.13.5\text{-}6)$$

where $k = k_i + k_f$ is broken down into integer and fractional components of k, and $K_f = 2^{k_f}$ is a Taylor series expansion of the fractional component of k. These operations significantly reduce the complexity necessary in calculating the combinatorial expressions by replacing multi-precision multiply and divide operations with 32 bit additions and a low complexity Taylor series approximation of $2^k$ followed by a multi-precision shift operation. All other components of the encoding/decoding operations are similar to that in 4.11.8.3.

While the invention has been particularly shown and described with reference to a particular embodiment, it will be understood by those skilled in the art that various changes in form and details may be made therein without departing from the spirit and scope of the invention. It is intended that such changes come within the scope of the following claims.

The invention claimed is:

1. A method for operating an encoder that produces a codeword (C) from an input vector (x), the method comprising the steps of:
receiving, by a vector generator of the encoder, an input signal;
creating, by the vector generator, the input vector;
receiving, by a combinational coding circuitry of the encoder, the input vector to be encoded, wherein the input vector comprises speech, audio, image, or video signals;
generating, by the combinational coding circuitry of the encoder, a first multi-precision operand ($\Psi'_k$) based on the input vector;
generating, by the combinational coding circuitry, a mantissa operand (M) and an exponent operand (h), wherein the mantissa operand and the exponent operand are representative of a second multi-precision operand (F'($p_k$, k)) that is based on the signal vector to be encoded;
selecting, by the combinational coding circuitry, a portion of the first multi-precision operand to be modified based on the exponent operand;
modifying, by the combinational coding circuitry, the portion of the first multi-precision operand based on the mantissa operand to produce a modified multi-precision operand ($\Psi'_{k+1}$); and
generating, by the combinational coding circuitry, the codeword (C) based on the modified multi-precision operand; wherein the codeword is for use by the encoder to encode the speech, audio, image, or video signals and by a corresponding decoder to decode the speech, audio, image, or video signals.

2. The method of claim 1 wherein $\Psi'_k$ is based on a set of mantissa and exponent operands that are representative of F'($p_i$, i); $1 \leq i < k$, where $p_i$ are the positions of the non-zero elements of the input vector x.

3. The method of claim 1 wherein $M \approx \lfloor 2^{k_f} \cdot 2^{min(k_i, l_R)} \rfloor$.

4. The method of claim 1 wherein h is a function $k_i$.

5. The method of claim 1 wherein the portion of the first multi-precision operand $\Psi'_k$ to be modified is represented by a location indicator defined by integers $w_l$ and $w_u$.

6. The method of claim 5 wherein $$w_l = \left\lfloor \frac{h}{16} \right\rfloor, w_u = \left\lfloor \frac{h + l_R}{16} \right\rfloor + 1,$$

where 16 is a word length and $l_R$ is a length of the mantissa.

7. The method of claim 1 wherein $\Psi'_{k+1} = \Psi'_k + F'(p_k, k)$.

8. The method of claim 1 wherein $C_\pi = \Psi'_{\nu+1}$.

9. An encoder comprising:
a vector generator creating an input vector x from a received input signal;
combinatorial coding circuitry to generate a codeword (C) wherein the combinational coding circuitry performing the steps of:
receiving the input vector x to be encoded, wherein the vector x comprises speech, audio, image, or video signals;
generating a first multi-precision operand ($\Psi'_k$) based on x;
generating a mantissa operand (M) and an exponent operand (h), wherein the mantissa operand and the exponent operand are representative of a second multi-precision operand (F'($p_k$, k)) that is based on the signal vector to be encoded;
selecting a portion of $\Psi'_k$ to be modified based on the exponent operand;
modifying the portion of $\Psi'_k$ based on the mantissa operand and location indicator to produce a modified multi-precision operand ($\Psi'_{k+1}$); and
generating a codeword (C) based on $\Psi'_{k+1}$; wherein the codeword is for use by the encoder to encode speech, audio, image, or video signals and by a corresponding decoder to decode the speech, audio, image, or video signals.

10. The encoder of claim 9 wherein $$\Psi'_k = \sum_{i=1}^{k-1} F'(p_i, i),$$

where $p_i$ are the positions of the non-zero elements of vector x.

11. The encoder of claim 9 wherein $M \approx \lfloor 2^{k_f} \cdot 2^{min(k_i, l_R)} \rfloor$.

12. The encoder of claim 9 wherein $h = min(0, k_i - l_R)$.

13. The encoder of claim 9 wherein the portion of $\Psi'_k$ to be modified is represented by a location indicator defined by integers $w_l$ and $w_u$ that identifies the words in the multi-precision codeword which are to be modified.

14. The encoder of claim 13 wherein $$w_l = \left\lfloor \frac{h}{16} \right\rfloor, w_u = \left\lfloor \frac{h + l_R}{16} \right\rfloor + 1,$$

where 16 is a word length and $l_R = 16$ is chosen as the length of the mantissa.

15. The encoder of claim 9 where $\Psi'_{k+1} = \Psi'_k + F'(p_k, k)$.

16. The encoder of claim 9 wherein $C_\pi = \Psi'_{\nu+1}$.

17. A method for operating a decoder that generates a vector (x) from a codeword (C), the method comprising the steps of:
receiving, by combinatorial decoding circuitry of the decoder, the codeword ($C_\pi$);
generating, by the combinatorial decoding circuitry, a first multi-precision operand ($\Psi'_{k+1}$) based on $C_\pi$;
generating, by the combinatorial decoding circuitry, a mantissa operand (M) and an exponent operand (h), wherein the mantissa operand and the exponent operand are representative of a second multi-precision operand (F'($p_k$, k));
selecting, by the combinatorial decoding circuitry, a portion of $\Psi'_{k+1}$ to be modified based on the exponent operand;
modifying, by the combinatorial decoding circuitry, the portion of $\Psi'_{k+1}$ based on the mantissa operand and location indicator to produce a modified multi-precision operand ($\Psi'_k$);
decoding, by the combinatorial decoding circuitry, a position $p_{k-1}$ of the (k−1)th non-zero elements of vector x;
generating the vector (x) based on the position $p_{k-1}$;
passing the vector x to signal reconstruction circuitry of the decoder, and creating, by the signal reconstruction circuitry, an output signal comprising speech, audio, image, or video based on the generated vector (x).

18. The method of claim 17 wherein $$\Psi'_k = \sum_{i=1}^{k-1} F'(p_i, i),$$

where $p_i$ are the positions of the non-zero elements of vector x.

19. The method of claim 17 wherein $M \approx \lfloor 2^{k_f} \cdot 2^{min(k_i, l_R)} \rfloor$.

20. A decoder comprising:
   combinatorial coding circuitry performing the steps of:
      receiving the codeword ($C_\pi$);
      generating a first multi-precision operand ($\Psi''_{k+1}$) based on $C_\pi$;
      generating a mantissa operand (M) and an exponent operand (h), wherein the mantissa operand and the exponent operand are representative of a second multi-precision operand ($F'(p_k,k)$) that is based on the signal vector to be encoded;
      selecting a portion of $\Psi''_{k+1}$ to be modified based on the exponent operand;
      modifying the portion of $\Psi''_{+1}$ based on the mantissa operand and location indicator to produce a modified multi-precision operand ($\Psi''_k$);
      decoding a position $p_{k-1}$ of the (k−1)th non-zero elements of vector x; and
      generating the vector (x) based on the position $p_{k-1}$ and
   signal reconstruction circuitry to create an output signal of speech, audio, image, or video signals using the vector (x).

* * * * *